United States Patent
Zhen et al.

(10) Patent No.: US 8,027,699 B2
(45) Date of Patent: Sep. 27, 2011

(54) SYSTEMS AND METHODS OF BAND AMPLIFICATION WITH A SHARED AMPLIFIER

(75) Inventors: Liping Zhen, Meriden, CT (US); Xiangqing Xu, Meriden, CT (US)

(73) Assignee: Alcatel Lucent, Paris (FR)

( * ) Notice: Subject to any disclaimer, the term of this patent is extended or adjusted under 35 U.S.C. 154(b) by 959 days.

(21) Appl. No.: 11/681,405

(22) Filed: Mar. 2, 2007

(65) Prior Publication Data

US 2008/0212502 A1    Sep. 4, 2008

(51) Int. Cl.
*H04M 1/00* (2006.01)
(52) U.S. Cl. .................. 455/550.1; 455/552.1; 375/295; 375/276
(58) Field of Classification Search .............. 455/550.1, 455/552.1; 370/276, 277, 282
See application file for complete search history.

(56) References Cited

U.S. PATENT DOCUMENTS

| | | | | |
|---|---|---|---|---|
| 6,005,884 | A * | 12/1999 | Cook et al. ................. | 375/132 |
| 6,128,508 | A * | 10/2000 | Francisco et al. ........... | 455/552.1 |
| 6,195,561 | B1 * | 2/2001 | Rose .......................... | 455/523 |
| 6,226,275 | B1 * | 5/2001 | Yang et al. .................. | 370/280 |
| 6,591,086 | B1 * | 7/2003 | Pleasant ...................... | 455/78 |
| 6,980,067 | B2 * | 12/2005 | Forrester et al. ............. | 333/133 |
| 7,454,170 | B2 * | 11/2008 | Goossens et al. ............ | 455/41.1 |
| 7,616,940 | B2 * | 11/2009 | Holder et al. ................ | 455/341 |
| 2002/0019239 | A1 * | 2/2002 | Kasapidis .................... | 455/456 |
| 2003/0062971 | A1 * | 4/2003 | Toncich ....................... | 333/202 |
| 2003/0068998 | A1 * | 4/2003 | Yamakawa et al. ........... | 455/339 |
| 2003/0153279 | A1 * | 8/2003 | Kang et al. ................... | 455/83 |
| 2003/0189910 | A1 * | 10/2003 | Yamada et al. ............... | 370/335 |
| 2004/0005913 | A1 * | 1/2004 | Bollenbeck .................. | 455/562.1 |
| 2004/0052272 | A1 * | 3/2004 | Frank .......................... | 370/458 |
| 2004/0113720 | A1 * | 6/2004 | Komuro et al. ............... | 333/133 |
| 2004/0196121 | A1 * | 10/2004 | Toncich ....................... | 333/207 |
| 2005/0026571 | A1 * | 2/2005 | Yang et al. ................... | 455/78 |
| 2005/0197078 | A1 * | 9/2005 | Yoshimoto ................... | 455/127.4 |
| 2005/0265482 | A1 * | 12/2005 | Peek et al. ................... | 375/316 |
| 2006/0279362 | A1 * | 12/2006 | Chang et al. ................. | 330/302 |
| 2007/0030095 | A1 * | 2/2007 | Hikita et al. ................. | 333/133 |
| 2007/0077898 | A1 * | 4/2007 | Mueller et al. .............. | 455/83 |
| 2008/0175175 | A1 * | 7/2008 | Oren et al. ................... | 370/279 |
| 2008/0205548 | A1 * | 8/2008 | Rofougaran ................. | 375/297 |
| 2008/0212502 | A1 * | 9/2008 | Zhen et al. ................... | 370/295 |
| 2008/0259438 | A1 * | 10/2008 | Krylov et al. ................ | 359/349 |
| 2009/0033547 | A1 * | 2/2009 | Kanto .......................... | 342/175 |

* cited by examiner

*Primary Examiner* — Temesgh Ghebretinsae
*Assistant Examiner* — Erica Fleming-Hall
(74) *Attorney, Agent, or Firm* — Kramer & Amado P.C.

(57) ABSTRACT

The present invention provides systems and methods for band amplification with a shared amplifier. In an exemplary embodiment, the wireless band amplification device has with an amplifier with an input port and an output port. The wireless band amplification device also provides two circulators, the first circulator in communication with the input port of the amplifier and the second circulator in communication with the output port of the amplifier. Additionally, two duplexer devices are provided in communication with both circulators. The input port of the amplifier is enabled to receive at least a first frequency band downlink signal and a first frequency band uplink signal. In an alternate embodiment, the input port of the amplifier can be further adapted to receive a second frequency band downlink signal and a second frequency band uplink signal. Additionally, the input port of the amplifier can be further adapted to receive a third frequency band downlink signal and a third frequency band uplink signal.

13 Claims, 9 Drawing Sheets

SYSTEMS AND METHODS OF BAND AMPLIFICATION WITH A SHARED AMPLIFIER

CROSS-REFERENCE TO RELATED APPLICATION(S)

This application discloses subject matter related to the subject matter disclosed in commonly owned, U.S. patent application Ser. No. 11/681,392, entitled "SYSTEMS AND METHODS OF EFFICIENT BAND AMPLIFICATION", filed, Mar. 2, 2007, in the names of Liping Zhen and Xiangqing Xu, which is hereby incorporated by reference in its entirety for all purposes.

TECHNICAL FIELD

The present invention relates generally to systems and methods of band amplification, and, in particular, to systems and methods of wireless communication band amplification with a shared amplifier.

BACKGROUND OF THE INVENTION

Wireless telecommunication has grown exponentially in the last decade and is fast becoming a communications backbone for a large sector of industries. In 1994, there were an estimated 16 million wireless telecommunication subscribers in the United States alone. By 2001, there were more than an estimated 118 million wireless telecommunication subscribers in the United States. In step with the rapid increase the number of wireless telecommunication subscribers, has been the growth in applications supported by wireless telecommunication service providers. As consumer reliance upon wireless applications increases, the demand for wireless telecommunication service coverage rises dramatically.

Wireless subscribers and wireless service providers often rely upon band amplifiers to expand and extend wireless coverage. For example, an in-building amplifier can be installed to increase signal reception and transmission for wireless subscribers in a particular office facility. Most wireless communication amplifiers are bidirectional and thus have capability of amplifying both uplink and downlink wireless signals such that both the reception to the subscriber and the transmission to the base station are improved.

Wireless amplifiers can be used in a variety of implementations, including providing extended service areas directly to wireless subscribers and amplifying signals passing between nodes in a wireless network. For example, wireless bidirectional amplifiers can be used to improve coverage to local service areas that have weak signal strengths. As the subscriber demand for wireless services increases, the necessity for inexpensive, efficient, and reliable equipment to provide that service increases.

Figure 1:
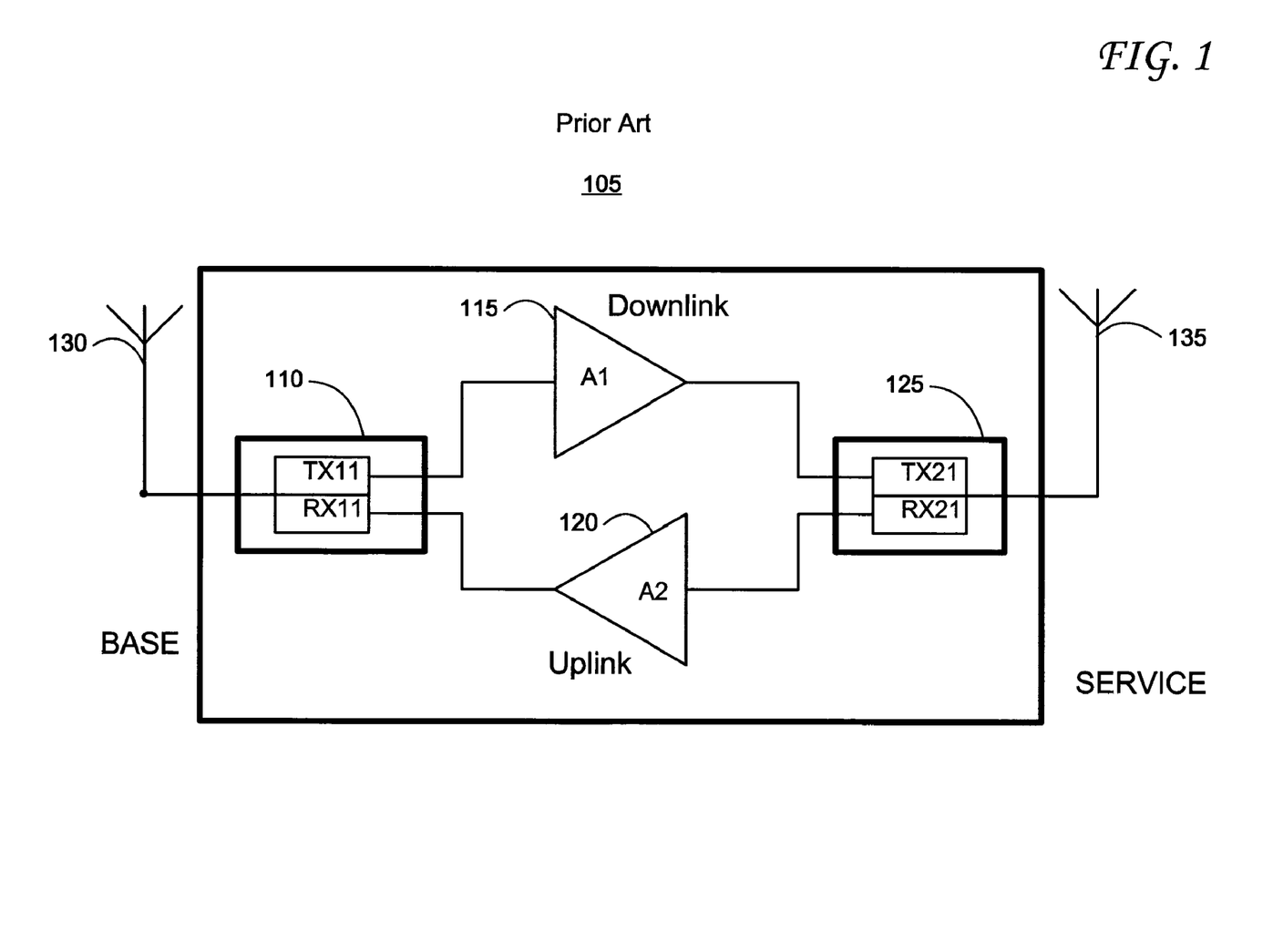
FIG. 1 illustrates a prior art single band bidirectional amplifier.

In the past, wireless communication systems were often covered by one frequency band. Therefore, the wireless bidirectional amplifiers used in these systems were only required to process one frequency band. FIG. 1 shows a conventional single band bidirectional amplifier 105. The conventional single band bidirectional amplifier 105 includes an uplink amplifier 120 and a downlink amplifier 115. The uplink amplifier 120 processes the signals received from the service antenna, antenna 135, to be transmitted via the base antenna 130. Similarly, the downlink amplifier 115 processes the signals received from the base antenna, antenna 130, to be transmitted via the service antenna, antenna 135. Duplexers are provided to pass the transmitted and received signals of the amplifier 105. For example, a signal received at antenna 130 is passed to duplexer 110 and likewise the duplexer 110 passes a signal to be transmitted to antenna 130. The duplexer 110 passes transmission signal, Tx1, through its TX11 filter to the input port of the downlink amplifier 115. The duplexer 110 also receives the received signal, Rx1, through its RX11 filter from the output port of the uplink amplifier 120. Similarly, duplexer 125 passes the uplink signal received from antenna 135 to the input port of the uplink amplifier 120 and passes the downlink signal received from downlink amplifier 115 to antenna 135 for transmission to the service area.

Figure 2:
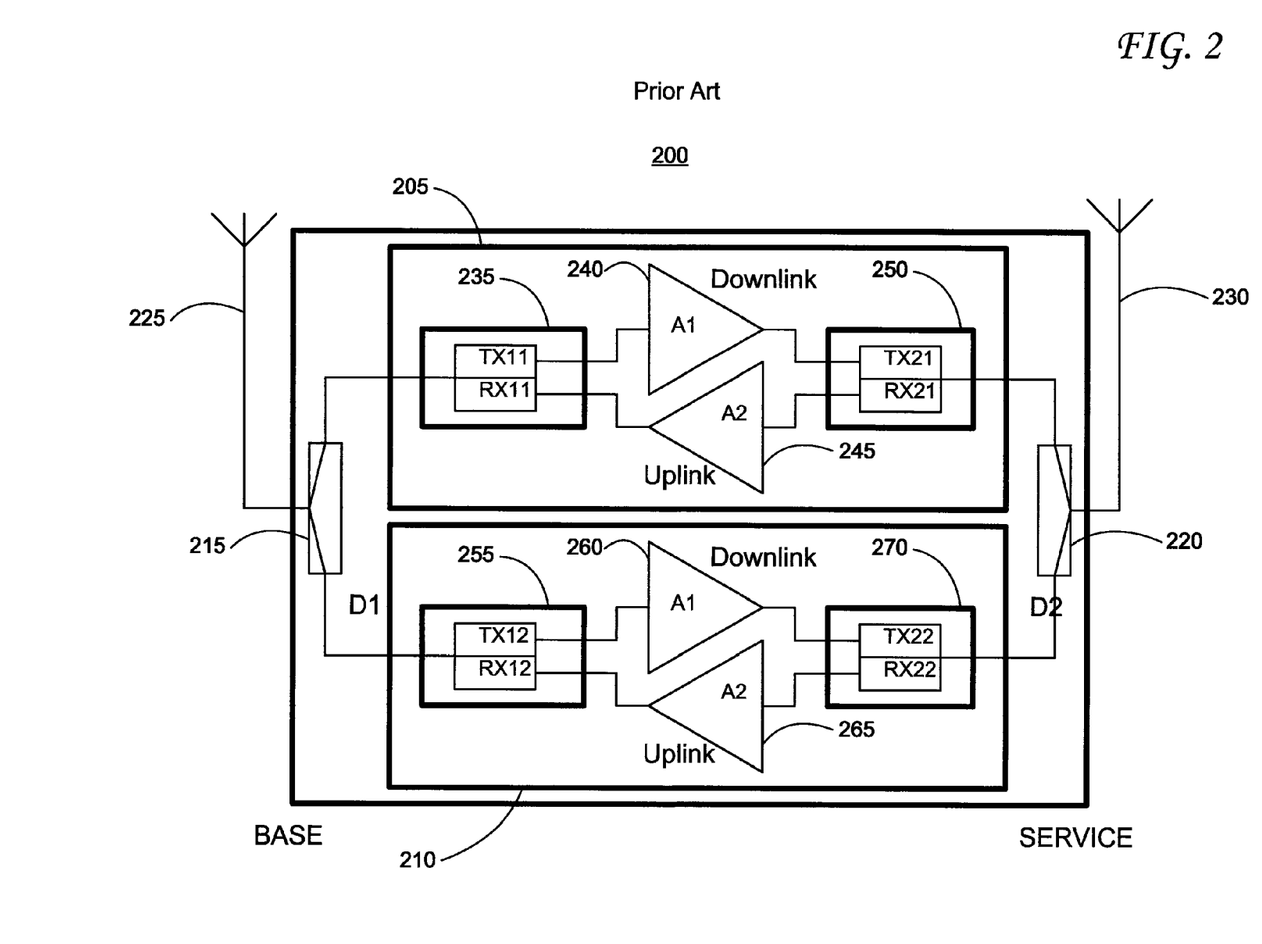
FIG. 2 illustrates a prior art dual band bidirectional amplifier.

Unlike the single band systems, more modern wireless telecommunication networks transmit signals over multiple frequency bands. To provide signal coverage for systems operating in two frequency bands, dual band bidirectional amplifiers were designed. Conventional dual band bidirectional amplifiers are constructed from two single band bidirectional amplifiers, such as 105, connected by two power dividers. FIG. 2 provides an illustration of a conventional dual band bidirectional amplifier 200. The two single band bidirectional amplifiers, 205 and 210, are provided as the central components of bidirectional amplifier 200. Two power dividers, 215 and 220, provide signal path for the two frequency bands transmitted and received by antenna 225 and antenna 230 into the bidirectional amplifiers 205 and 210.

Similar to the amplifier shown in FIG. 1, the first single band bidirectional amplifier 205 includes a duplexer 235, a downlink amplifier 240, an uplink amplifier 245, and a duplexer 250. The duplexer 235 passes transmission signal, Tx1, through its TX11 filter to the input port of the downlink amplifier 240. The duplexer 235 also receives the amplified uplink signal, Rx1, through its RX11 filter from the output port of the uplink amplifier 245. Similarly, duplexer 250 passes the uplink signal, Rx1, through its RX21 filter received from power divider 220 to the input port of the uplink amplifier 245 and passes the amplified downlink signal, Tx1, through its TX21 filter received from downlink amplifier 240 to power divider 220 for transmission via antenna 230.

The second single band bidirectional amplifier 210 is provisioned in a manner similar to that of the first single band bidirectional amplifier 205, such that it includes a duplexer 255, a downlink amplifier 260, an uplink amplifier 265, and a duplexer 270. The duplexers, 255 and 270, pass the received and transmitted signals to the appropriate amplifier, 260 or 265.

While suitable for its intended purposes, the conventional dual band bidirectional amplifier 200 depicted in FIG. 2 suffers from a number of drawbacks. Significantly, the addition of the power dividers, 215 and 220, to the circuit inserts a large amount of loss and noise into the amplifier device. For example, in one embodiment the system gain for the dual band bidirectional amplifier 200 is 6 dB lower than in the single band bidirectional amplifier 100 configuration due to the additional loss of the power dividers, 215 and 220. Furthermore, in that embodiment the power dividers, 215 and 220, reduce the output power by 3 dB and increase the noise figure by 3 dB. An additional drawback to the dual band bidirectional amplifier 200 depicted in FIG. 2 relates to the cost of the device. As illustrated in FIG. 2, the dual band amplifier 200 configuration involves more than double the components of the single band amplifier 100 configuration; thus, the cost of the dual band amplifier 200 is more than double. As with any network element, cost is a large factor and one that can potentially be implementation prohibitive with respect to wireless telecommunication systems.

Figure 3:
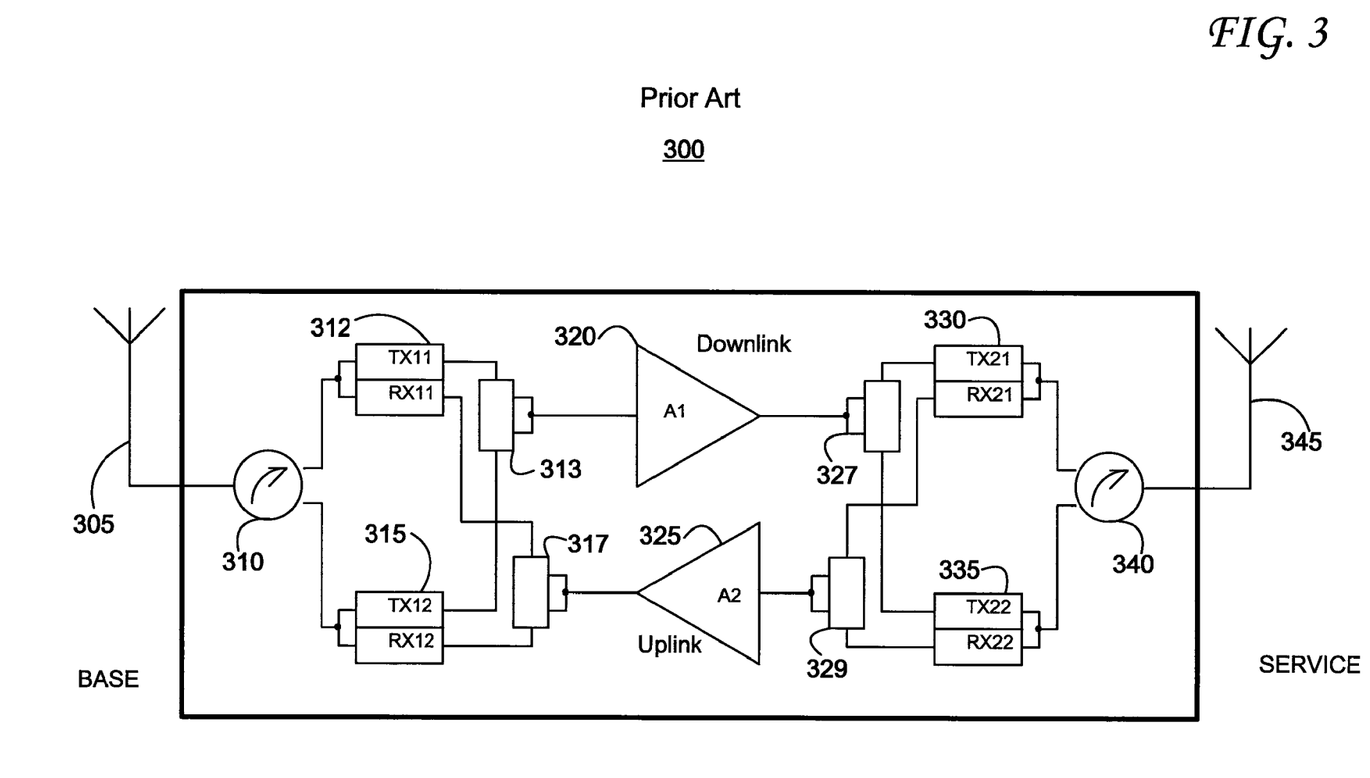
FIG. 3 illustrates a prior art dual band bidirectional amp.

To overcome the drawbacks associated with designs like the dual band bidirectional amplifier 200, amplifiers were designed in an attempt to limit power loss and cost of the device. FIG. 3 is an illustration of an improved dual band bidirectional amplifier 300 as described in U.S. Pat. No. 6,993,286. The dual band bidirectional amplifier 300 is capable of amplifying signals in two frequency bands from antenna 305 and antenna 345 with only one amplifier chain. More particularly, whereas the dual band bidirectional amplifier 200 shown in FIG. 2 requires two downlink amplifiers, 240 and 260 and two uplink amplifiers, 245 and 265, the dual band bidirectional amplifier 300 shown in FIG. 3 requires only one downlink amplifier 320 and one uplink amplifier 325.

In FIG. 3, downlink signals, are received at the base antenna 305. These downlink signals are passed to a first circulator 310. The circulator 310 is responsible for distributing the downlink signals to the appropriate duplexer. It also passes the uplink signals to transmit at the base antenna 305.

Duplexer 312 is configured to pass the uplink signal, Rx1, and downlink signal, Tx1, in the first frequency band. It routes the downlink signal, Tx1, from circulator 310 to the input port of downlink amplifier 320 via T-cable 313. It also routes the amplified uplink signal Rx1, from the output port of uplink amplifier 325 via T-cable 317 to circulator 310. Duplexer 315, on the other hand, is configured to pass the uplink signal, Rx2, and downlink signal, Tx2, in the second frequency band. It routes downlink signal, Tx2, from circulator 310 to the input port of downlink amplifier 320 via T-cable 313. It also routes the amplified uplink signal, Rx2, from output port of uplink amplifier 325 via T-cable 317 to circulator 310.

As illustrated in the FIG. 3, on the service side of the device, Duplexer 330 works similarly to Duplexer 312. Duplexer 330 is configured to pass the uplink signal, Rx1, and downlink signal, Tx1 of the first frequency band. It routes the uplink signal, Rx1, from circulator 340 to the input port of uplink amplifier 325 via T-cable 329. It also routes the amplified downlink signal Tx1, from the output port of downlink amplifier 320 via T-cable 327 to circulator 340. Duplexer 335, on the other hand, works similarly to Duplexer 315. It is configured to pass the uplink signal, Rx2, and downlink signal, Tx2, in the second frequency band. It routes uplink signal, Rx2, from circulator 340 to the input port of uplink amplifier 325 via T-cable 329. It also routes the amplified downlink signal, Tx2, from output port of downlink amplifier 320 via T-cable 327 to circulator 340.

T-cables 313 and 329 can combine the signals from both frequency bands to be amplified by either the downlink amplifier 320 or the uplink amplifier 325. T-cables 317 and 327 feed the amplified signals of both frequency bands to respective duplexers, 312, 315, 330 and 335.

Circulator 340 passes the first frequency downlink signal, Tx1, with the second frequency downlink signal, Tx2, for transmission via antenna 345. It also distributes the first and second frequency uplink signals, Rx1 and Rx2, received from antenna 345 and routes them to the appropriate duplexer, either 330 or 335.

Dual band bidirectional amplifier 300 improves upon the design of previous dual band amplifiers by implementing a single wide band bidirectional amplifier chain having only one uplink amplifier 325 and one downlink amplifier 320. The wide band bidirectional amplifier chain is capable of amplifying both of the frequency bands of the system.

The design of dual band bidirectional amplifier 300 exhibits some superior characteristics in comparison to the design of dual band bidirectional amplifier 200. Due to the elimination of the power dividers, the dual band bidirectional amplifier 300 inserts less power loss and gain loss into the system. For example, in some implementations the output power of the dual band bidirectional amplifier 300 is 2 dB higher than the output power of dual band bidirectional amplifier 200. Additionally, the dual band bidirectional amplifier 300 exhibits improved sensitivity in comparison to other design such as the dual band bidirectional amplifier 200. Furthermore, the dual band bidirectional amplifier 300 costs less than other designs due in large part to the face that it only requires one amplifier chain.

While the design of band amplifiers, such as dual band bidirectional amplifier 300, have been successful at overcoming some of the limitations and drawbacks of previous designs, there are some drawbacks that have been unaddressed. These unaddressed drawbacks are magnified by the increasing complexity of wireless telecommunication systems, especially if the systems operate with more than two frequency bands.

Therefore a need exists for a system or method that will address the limitations and drawbacks of the prior art band amplification devices.

Additionally, a need exists for a system or method to provide efficient band amplification in dual band wireless telecommunication systems.

Additionally, a need exists for a system or method to provide efficient band amplification in triple band wireless telecommunication systems.

Additionally, a need exists to provide a band amplification device with minimum band amplifiers.

Furthermore, a need exists to reduce system complexity, provide a cost effective device, and power efficient device to band amplification in triple band wireless telecommunication systems.

BRIEF SUMMARY OF THE INVENTION

Briefly described, in a preferred form, the present invention provides systems and methods for band amplification with a shared amplifier. In an exemplary embodiment, the wireless band amplification device has an amplifier with an input port and an output port. The wireless band amplification device also provides two circulators, the first circulator in communication with the input port of the amplifier and the second circulator in communication with the output port of the amplifier. Additionally, two duplexer devices are provided in communication with both circulators. The input port of the amplifier is enabled to receive at least a first frequency band downlink signal and a first frequency band uplink signal. In an alternate embodiment, the input port of the amplifier can be further adapted to receive a second frequency band downlink signal and a second frequency band uplink signal. Additionally, the input port of the amplifier can be further adapted to receive a third frequency band downlink signal and a third frequency band uplink signal.

These and other objects, features and advantages of the present invention will become more apparent upon reading the following specification in conjunction with the accompanying drawings.

DETAILED DESCRIPTION OF THE PREFERRED EMBODIMENTS

The present invention addresses the deficiencies in the prior art by providing a wireless band amplification device that is capable of efficiently amplifying signals with a shared amplifier. In an exemplary embodiment of the present invention, the wireless band amplification device includes only one amplifier. More particularly, the exemplary embodiment of the wireless band amplification device does not include an amplifier chain with a downlink amplifier and an uplink amplifier. Furthermore, the exemplary embodiment of the wireless band amplification device has a power loss that is comparable to that of single band wireless amplification devices.

In an exemplary embodiment of the present invention, the wireless band amplification device has an amplifier with an input port and an output port. The wireless band amplification device also provides two circulators, the first circulator in communication with the input port of the amplifier and the second circulator in communication with the output port of the amplifier. Additionally, two duplexer devices are provided in communication with both circulators. The input port of the amplifier can be enabled to receive at least a first frequency band downlink signal and a first frequency band uplink signal.

Figure 4:
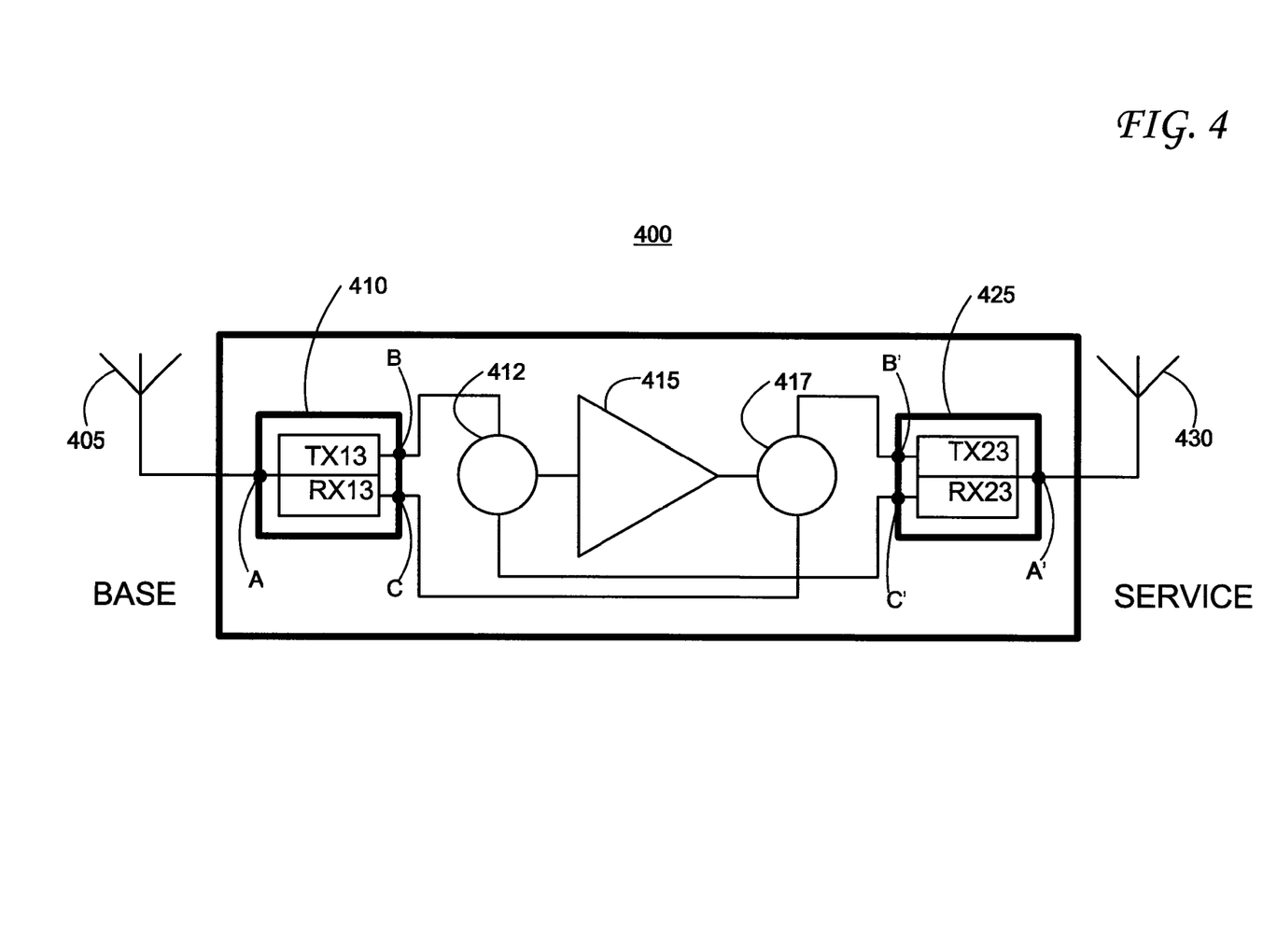
FIG. 4 displays a single band bidirectional amplification device 400 in accordance with an exemplary embodiment of the present invention.

Referring now in detail to the drawing figures, wherein like reference numerals represent like parts throughout the several views, FIG. 4 displays a single band bidirectional amplification device 400 in accordance with an exemplary embodiment of the present invention. As shown in FIG. 4, the single band bidirectional amplification device 400 provides a device with one amplifier compared to the single band amplifiers of prior art, such as single band bidirectional amplifier 105 shown in FIG. 1. Notably, the exemplary embodiment of the single band bidirectional amplification device 400 depicted in FIG. 4 contains only one amplifier, amplifier 415. Unlike prior art devices, the single band bidirectional amplification device 400 does not have an amplifier chain with an uplink amplifier and downlink amplifier, such as uplink amplifier 120 and a downlink amplifier 115 of the single band bidirectional amplifier 105 shown in FIG. 1, but rather one amplifier 415 adapted to amplify both the uplink signal and the downlink signal.

In the exemplary embodiment depicted in FIG. 4, the single band bidirectional amplification device 400 has duplexer device 410 and duplexer device 425. The term duplexer device is used herein to generally refer to both conventional duplexer devices and duplexer devices enabled to receive signals of multiple frequency bands. Exemplary embodiments of duplexer devices enabled to receive signals of multiple frequency bands are more fully and completely described in the copending U.S. patent application Ser. No. \_\_\_\_\_\_\_\_, filed January 2007, entitled "Systems and Methods of Efficient Band Amplification," which is hereby incorporated by reference in its entirety as if fully set forth below (herein referred to as "copending patent application entitled 'Systems and Methods of Efficient Band Amplification'"). Both duplexer devices, 410 and 425, can have three ports. In an exemplary embodiment, the duplexer device 410 has Port A in communication with the antenna 405, Port B in communication with a circulator 412, and Port C in communication with circulator 417. Additionally, in an exemplary embodiment, Port A' of duplexer device 425 is connected to antenna 430, Port B' is connected to circulator 417, and Port C' is connected to circulator 412. Ports A and A', in communication with antenna 405 and antenna 430, are bidirectional ports that pass both the uplink and downlink signals of a desired frequency band.

Those of skill in the art will appreciate that the frequency band processed could be a variety of transmission and reception frequency ranges. Different wireless technologies utilize different transmission and reception frequencies, and there are numerous different wireless technologies. In the U.S., the commonly used frequency bands in wireless communication include the 800 MHz, 900 MHz and 1900 MHz frequency bands. Different wireless systems can be implemented in these frequency bands. For example, a Specialized Mobile Radio Service (SMR) can be implemented in 800 MHz band or 900 MHz band, referred to as SMR800 and SMR900 respectively. Personal Cellular Service (PCS) can operate in the 1900 MHz band, referred to as PCS1900.

With a large variation in wireless technologies and implementations, band amplification devices need to be able to process and amplify signals in a variety of frequencies. In a non-limiting example of an embodiment of the single band bidirectional amplification device 400, the frequency band processed by the device may be in the 800 MHz range. Alternatively, the frequency band processed by the device may be in the 900 MHz range. In another non-limiting embodiment, the frequency band may be in a 1900 MHz frequency band.

The duplexer device 410, shown in FIG. 4, provides signal path for both the downlink and uplink signals of the desired frequency band for antenna 405. Port A of the duplexer device 410 can be a bi-directional port. In one direction, it couples the downlink signal, Tx3, of the desired frequency band from antenna 405, into the filter, TX13. In the other direction, it couples the uplink signal, Rx3, of the desired frequency band from filter RX13 to the antenna 405. Port B of duplexer device 410 can connect the downlink signal, Tx3, of the desired frequency band to circulator 412 for further processing by the amplifier 415. The reception port of duplexer device 410, Port C, can be capable of connecting the amplified uplink signal, Rx3, from circulator 417 to filter, RX13. Thus, in an exemplary embodiment the downlink signal Tx3 may be received from the antenna 405, passed through the filter, TX13, of the duplexer device 410 and be passed to circulator 412. Furthermore, the amplified uplink signal Rx3 can be received by filter, RX13, in duplexer device 410 from the circulator 417, and passed to antenna 405.

In an exemplary embodiment, the amplifier 415 can be a wide band amplifier capable of amplifying both of the downlink and uplink signals in the desired frequency band of the system. In an exemplary embodiment, the circulator, 412, can be responsible for distributing the downlink signal, Tx3 from duplexer device 410 and the uplink signal, Rx3, from duplexer device 425 to the amplifier 415. The circulator 417 can be responsible for passing the amplified downlink signal, Tx3, from amplifier 415 to duplexer device 425 and uplink signals from amplifier 415 to duplexer device 410. A circulator can most often be a passive directional device with signal traveling in one circular direction. A circulator can be designed to cover signal in a specific frequency band. In an exemplary embodiment of the single band bidirectional amplification device 400, circulators 412 and 417 are designed to cover the desired frequency band amplified by single band bidirectional amplification device 400.

The configuration of the exemplary embodiment of the single band bidirectional amplification device 400 shown in FIG. 4 enables certain signal paths. For example, and not limitation, the downlink signal, Tx3, may be received on antenna 405 and passed to Port A of duplexer device 410. The downlink signal, Tx3, may then pass through the filter TX13 and pass to Port B of the duplexer 410. Port B may pass the downlink signal, Tx3 to circulator 412, which routes the signal to the input port of the amplifier 415. Once amplified, the downlink signal, Tx3, may pass to circulator 417, and then be routed to Port B' of duplexer device 425, through the filter TX23 to Port A' of duplexer device 425. The duplexer device 425 can then communicate the downlink signal, Tx3, to antenna 430 for transmission to the service area. Likewise, a similar reverse signal path can be enabled for uplink signal, Rx3. Antenna 430 may receive uplink signal, Rx3, pass it to duplexer device 425, and through filter RX23 to port C', then pass to the circulator 412, which routes the signal to the input port of the amplifier 415 for amplification. Once amplified, the uplink signal, Rx3, can be passed to circulator 417 and then to port C of duplexer device 410. After being passed through the RX13 filter of duplexer device 410, the uplink signal, Rx3, can be transmitted by antenna 405 to the base station.

The exemplary embodiment of the single band bidirectional amplification device 400 depicted in FIG. 4 allows for significant advancement over prior art devices. Significantly, the configuration of the circulators 412 and 417 enables the amplifier 415 to amplify both the uplink signal and the downlink signal. Thereby, the need for both a downlink and an uplink amplifier can be eliminated. In the exemplary embodiment of the single band bidirectional amplification device 400 depicted in FIG. 4, the circulators 412 and 417 enable the removal of one amplifier. As amplifier components are generally as much as 20 to 30 times more expensive than circulator components, a cost effective band amplification device can be enabled by the embodiments of the present invention.

Figure 5:
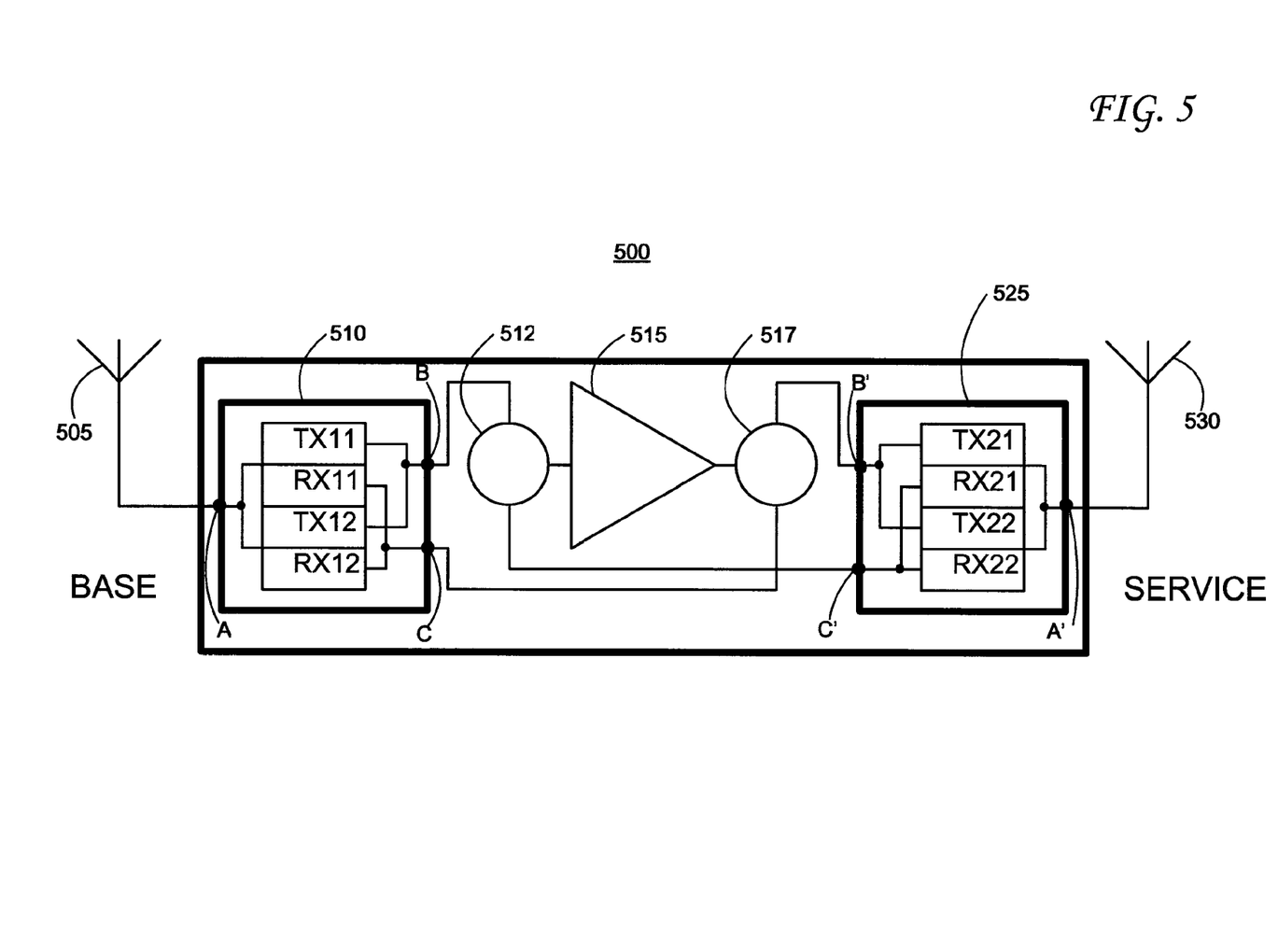
FIG. 5 displays a dual band bidirectional amplification device 500 in accordance with an exemplary embodiment of the present invention.

FIG. 5 displays a dual band bidirectional amplification device 500 in accordance with an exemplary embodiment of the present invention. As shown in FIG. 5, the dual band bidirectional amplification device 500 provides a device with one amplifier compared to the dual band amplifiers of prior art. Notably, the dual band bidirectional amplification device 500 contains only one amplifier, amplifier 515. Amplifier 515 can be capable of amplifying downlink signal and uplink signals of two frequency bands. In the exemplary embodiment depicted in FIG. 5, the dual band bidirectional amplification device 500 has duplexer device 510 and duplexer device 525. Both duplexer device 510 and duplexer device 525 can be dual-duplexers having three ports. For example, duplexer device 510 can have ports A, B, and C. Port A can be a bi-directional port, capable of coupling and matching four signals, the uplink and downlink signals of a first frequency band and the uplink and downlink signals of a second frequency band. Port B of duplexer device 510 can couple and match the downlink signals of both frequency bands to circulator 512. The reception port of duplexer device 510, Port C, can be capable of coupling and connecting the two amplified uplink signals of both frequency bands from circulator 517 to their respective filters. Those of skill in the art will appreciate that the first and second frequency bands may be a variety of different frequencies used in wireless system configurations.

The exemplary embodiment of the duplexer device 510, shown in FIG. 5, may receive both the first and second frequency band downlink signals via antenna 505 and pass these downlink signals via circulator 512 for amplification by one amplifier, amplifier 515. For many embodiments of the present invention, it can be beneficial to implement a duplexer device with characteristics similar to those of duplexer device 510, including the ability to receive signals of multiple frequency bands. Exemplary embodiments of such duplexers are more fully and completely described in the copending patent application entitled 'Systems and Methods of Efficient Band Amplification. Alternatively, conventional duplexers may be configured to pass the signals of both frequency bands to the amplifier 515.

Port A of the duplexer device 510 may couple and match four signals, downlink signals, Tx1 and Tx2, and uplink signals, Rx1 and Rx2, of the first and second frequency bands, to or from their respective signal filters, TX11, TX12, RX11 and RX12. Port B of duplexer device 510 can couple and match the downlink signals, Tx1 and Tx2, of the two frequency bands from their respective filters, TX11 and TX12, to the amplifier 515 via circulator 512. The reception port of duplexer device 510, Port C, can be capable of coupling and connecting the two amplified uplink signals, Rx1 and Rx2, from amplifier 515 via circulator 517 to their respective filters, RX11 and RX12.

In an exemplary embodiment, the downlink signal, Tx1, of the first frequency band can be input at Port A and output at Port B of the duplexer device 510, while the amplified uplink signal, Rx1, of the first frequency band can be input at Port C and output at Port A. Similarly, the downlink signal, Tx2, of the second frequency band can be input at Port A and output at Port B of the duplexer device 510 and the amplified uplink signal, Rx2, can be input at Port C and output at Port A.

In an exemplary embodiment, the duplexer device 525 on the service side of the dual band bidirectional amplification device 500 can be implemented in much the same way as duplexer device 510. Like duplexer device 510, duplexer device 525 has three ports, A', B', and C'. The duplexer device 525, shown in FIG. 5, can receive both the first and second frequency band uplink signals via antenna 530 and pass these uplink signals via circulator 512 for amplification by one amplifier, amplifier 515. Port A' of the duplexer device 525 can be a bidirectional port, capable of coupling and matching four signals. In one direction, it couples the amplified downlink signals, Tx1 and Tx2, of both frequency bands from their respective filters, TX21 and TX22, to antenna 530. In the other direction, it couples and connects the uplink signals, Rx1 and Rx2, of both frequency bands received from antenna 530 to their respective filters, RX21 and RX22. Port B' can couple and connect the two amplified downlink signals, Tx1 and Tx2, to their respective filters, TX21 and TX22. While Port C' of duplexer device 525 can couple and match the uplink signals, Rx1 and Rx2, of the two frequency bands from their respective filters, RX21 and RX22 to the amplifier 515 via circulator 512.

In an exemplary embodiment of the dual band bidirectional amplification device 500, the uplink signal, Rx1, of the first frequency band may be input at Port A' and output at Port C' of the duplexer device 525, while the amplified downlink signal, Tx1, of the first frequency band may be input at Port B' and output at Port A'. Similarly, the uplink signal, Rx2, of the second frequency band may be input at Port A' and output at Port C' of the duplexer device 525 and the amplified downlink signal, Tx2, may be input at Port B' and output at Port A'.

The dual band bidirectional amplification device 500 enables bidirectional amplification of signals from two separate frequency bands by amplifier 515. Some prior art devices, on the other hand, use four amplifier components to accomplish the same band amplification. The reduction in components in the dual band bidirectional amplification device 500, among other improvements, reduces the power loss created by the system and the noise insertion in comparison to prior art devices.

Figure 6:
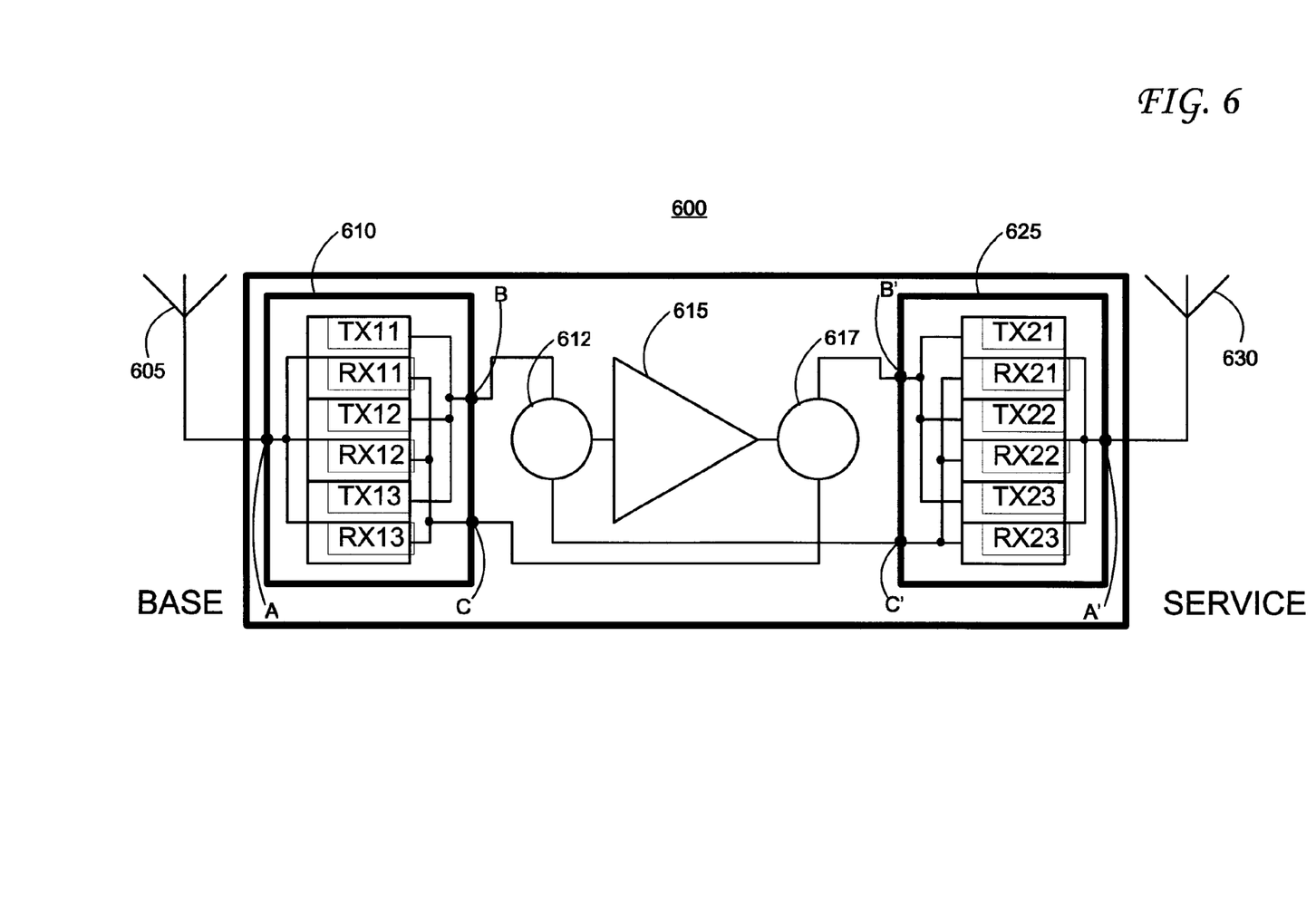
FIG. 6 displays a triple band bidirectional amplification device 600 in accordance with an exemplary embodiment of the present invention.

FIG. 6 displays a triple band bidirectional amplification device 600 in accordance with an exemplary embodiment of the present invention. As shown in FIG. 6, the triple band bidirectional amplification device 600 provides a device with one amplifier to amplify both downlink and uplink signals from three frequency bands. Notably, the triple band bidirectional amplification device 600 contains two duplexer devices, two circulators, and only one amplifier. The amplifier 615 can be capable of amplifying both downlink and uplink signals for three distinct frequency bands.

In the exemplary embodiment depicted in FIG. 6, the triple band bidirectional amplification device 600 has duplexer device 610 and duplexer device 625. Both duplexer device 610 and duplexer device 625 are tri-duplexers with at least three ports. For example, duplexer device 610 has Ports A, B, and C. Port A can be a bidirectional port, capable of coupling and matching six signals, the uplink and downlink signals of a first frequency band, the uplink and downlink signals of a second frequency band and the uplink and downlink signals of the third frequency band. Port B of duplexer device 610 can couple and match the downlink signals, Tx1, Tx2, and Tx3, of three frequency bands to circulator 612. The reception port of duplexer device 610, Port C, can be capable of coupling and connecting the amplified uplink signals, Rx1, Rx2, and Rx3, of three frequency bands from circulator 617 to their respective filters. Those of skill in the art will appreciate that the first, second, and third frequency bands can be a variety of different frequencies used in wireless system configurations.

The exemplary embodiment of the duplexer device 610, shown in FIG. 6, may receive the first, second, and third frequency band downlink signal via antenna 605. For many embodiments of the present invention, it can be beneficial to implement a duplexer with characteristics similar to those of duplexer device 610, including the ability to receive signals of multiple frequency bands. As described above, exemplary embodiments of such duplexers are more fully and completely described in the previously referenced copending patent application entitled "Systems and Methods of Efficient Band Amplification." Alternatively, conventional duplexers may be configured to pass the signals of both frequency bands to the amplifier 615.

Port A of the duplexer device 610 may couple and match six signals, downlink signals, Tx1, Tx2 and Tx3, and uplink signals, Rx1, Rx2 and Rx3, of the first, second third frequency bands, to or from their respective signal filters, TX11, TX12, TX13, RX11, RX12 and RX13. Port B of dual-duplexer 610 can couple and match the downlink signals, Tx1, Tx2 and Tx3, of the three frequency bands from their respective filters, TX11, TX12 and TX13 to the amplifier 615 via circulator 612. Port C can be capable of coupling and connecting the three amplified uplink signals, Rx1, Rx2 and Rx3, from amplifier 615 via circulator 617 to their respective filters, RX11, RX12 and RX13.

In an exemplary embodiment, the downlink signal, Tx1, of the first frequency band can be input at Port A, passed through the filter, TX11, and output at Port B of the duplexer device 610 to amplifier 615 via circulator 612. The amplified uplink signal, Rx1, of the first frequency band can be passed from circulator 617 and input at Port C and output at Port A of the duplexer device 610 through its filter, RX11. Similarly, the downlink signals, Tx2 and Tx3 of the second and third frequency bands can be received from antenna 605 and input at Port A and output at Port B of the duplexer device 610 through their respective filters, TX12 and TX13. The amplified uplink signals, Rx2 and Rx3, can be passed from circulator 617 and input at Port C and output at Port A through their respective filters, RX12 and RX13.

In an exemplary embodiment, the duplexer device 625 on the service side of the triple band bidirectional amplification device 600 can be implemented in much the same way as duplexer device 610. Like duplexer device 610, duplexer device 625 has three ports, A', B', and C'. The duplexer device 625, shown in FIG. 6, provides signal path for both downlink and uplink signals of the first, second, and third frequency band for antenna 630. Port A' of the duplexer device 625 can be a bidirectional port. In one direction, Port A' can couple the uplink signal, Rx1, Rx2, and Rx3 of the first, second and third frequency bands from antenna 630 into their respective filters, RX21, RX22 and RX23. In the other direction, it couples the amplified downlink signals, Tx1, Tx2 and Tx3, of the first, second and the third frequency bands from their respective filters, TX21, TX22 and TX23 to the antenna 630. The reception port of duplexer device 625, Port B', can couple the amplified downlink signals, Tx1, Tx2 and Tx3, of the three frequency bands routed from circulator 617 and connect them to their respective filters, TX21, TX22 and TX23. While Port C' can be capable of coupling and matching three uplink signals, Rx1, Rx2 and Rx3, from their respective filters, RX21, RX22 and RX23, to circulator 612 for further processed by amplifier 615.

In an exemplary embodiment, the uplink signal, Rx1, of the first frequency band may be input at Port A' and output at Port C' of the duplexer device 625. The amplified downlink signal, Tx1, of the first frequency band may be routed from circulator 617 and input at Port B' and output at Port A'. Similarly, the uplink signal, Rx2, of the second frequency band may be input at Port A' and output at Port C' of the duplexer device 625 and the amplified downlink signal, Tx2, may be passed from circulator 617 and input at Port B' and output at Port A'. Also, the uplink signal, Rx3, of the third frequency band may be input at Port A' and output at Port C' of the duplexer device 625 and the amplified downlink signal, Tx3, may be passed from circulator 617 and input at Port B' and output at Port A'.

While the exemplary embodiment of the triple band bidirectional amplification device 600 shown in FIG. 6 provides many significant advancements over the prior art, alternative embodiments of the present invention can be advantageous for particular implementations. In a non-limiting example, the exemplary embodiment of the triple band bidirectional amplification device 600 shown in FIG. 6 provides good performance results when the three frequency bands being transmitted and received are reasonably close together in the frequency spectrum. In other implementations, however, that have three frequency bands that are relatively disparate, it becomes increasingly difficult to provide an amplifier capable of processing all three frequency ranges with good linear performance. For example, and not limitation, some band amplification implementations may require amplification of signals in the 800 MHz frequency band, the 900 MHz frequency band, and the 1900 MHz frequency band. In such an implementation, it can be desirable to implement an alternative embodiment of the present invention in which more than one amplifier is used.

Those of skill in the art will appreciate that different band amplification designs and implementations will require different demands and tolerances. For example, some systems may place a greater importance on cost rather than the performance of the amplification device. Other implementations may set stricter tolerances on the noise and loss levels associated with band amplification and less restraints on the cost of the band amplification device. Those of skill in the art will appreciate that specific design of the various embodiments of the present invention can allow for these modifications without detracting from the scope of the present invention.

Figure 7:
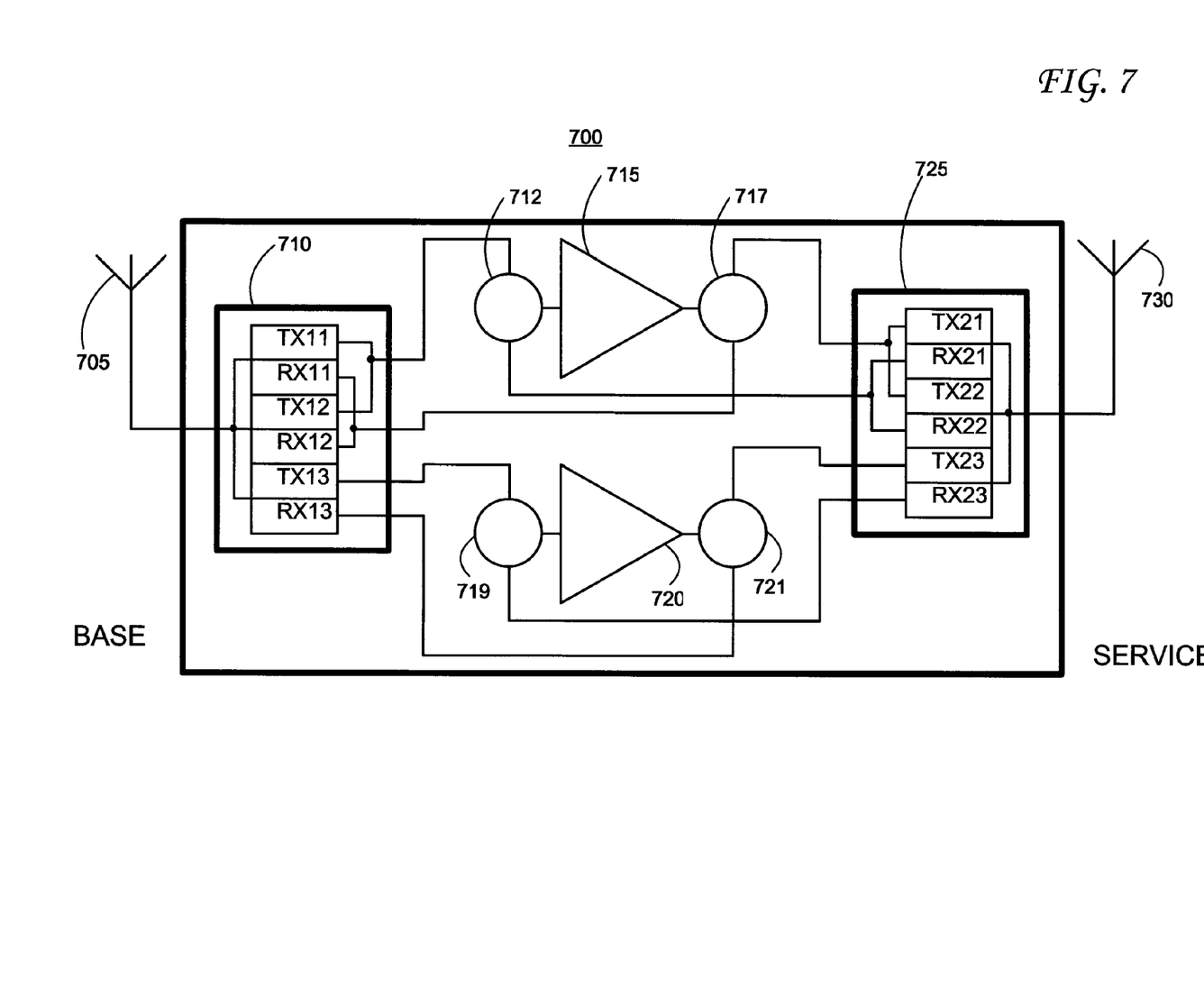
FIG. 7 displays a triple band bidirectional amplification device 700 in accordance with an alternative embodiment of the present invention FIG. 8 displays a dual band bidirectional amplification device 800 in accordance with an alternative embodiment of the present invention.

FIG. 7 displays a triple band bidirectional amplification device 700 in accordance with an alternative embodiment of the present invention. As shown in FIG. 7, the triple band bidirectional amplification device 700 provides a device with two amplifiers, each to amplify both downlink and uplink signals in at least one frequency band, and two circulator pairs compared to the triple band bidirectional amplification device 600 shown in FIG. 6. The exemplary embodiment of the triple band bidirectional amplification device 700 shown in FIG. 7 employs an amplifier 715 to process a portion of the signals and another amplifier 720 to process another portion of the signals. In the exemplary embodiment shown in FIG. 7, amplifier 715 process both downlink and uplink signals from two frequency bands and amplifier 720 processes both downlink and uplink signals from a third frequency band. In a non-limiting example, the amplifier 715 may be designed to process signals in the 800 MHz band and 900 MHz band, while amplifier 720 may be designed to process signals in the 1900 MHz frequency band. The alternative embodiment of the triple band bidirectional amplification device 700 enables the two amplifiers to be designed to process signals in a relatively smaller portion of the frequency spectrum. Thus, these amplifiers can achieve better linear performance and efficiency than amplifiers designed to process a comparably large portion of the frequency spectrum.

In an exemplary embodiment, the triple band bidirectional amplification device 700 may include two duplexer devices 710 and 725. Similar to the duplexer devices 610 and 625 of triple band bidirectional amplification device 600 shown in FIG. 6, the duplexer devices 710 and 725 provide downlink and uplink signal paths for all three frequency bands. In the exemplary embodiment of the triple band bidirectional amplification device 700 shown in FIG. 7, duplexer device 710 may be enabled to pass downlink signals, Tx1 and Tx2 from the first and second frequency bands through their respective filters, TX11 and TX12 to the circulator 712 to be amplified by amplifier 715. Furthermore, duplexer device 710 may be enabled to pass the downlink signal, Tx3, from the third frequency band, through its filter, TX13, to circulator 719 to be amplified by amplifier 720. Duplexer device 710 may also pass amplified uplink signals, Rx1 and Rx2, of the first two frequency bands from circulator 717 through the respective filters, RX11 and RX12, and Rx3 of the third frequency band from circulator 721 through filter RX13. Similarly, duplexer device 725 may be enabled to pass uplink signals, Rx1 and Rx2, from the first and second frequency bands, to the circulator 712 to be amplified by amplifier 715. Additionally, duplexer device 725 may be enabled to pass the uplink signal, Rx3, from the third frequency band to circulator 719 to be amplified by amplifier 720. Duplexer device 725 may also pass amplified downlink signals, Tx1 and Tx2, from the first and second frequency bands, routed by circulator 717 to respective filters, TX21 and TX22, and Tx3 from the third frequency band routed by circulator 721 to filter TX23. Thus, an efficient bidirectional band amplification device is provided that utilizes only two amplifiers to provide efficient and reliable bidirectional amplification of signals in three frequency bands.

In an exemplary embodiment of the present invention, integrated duplexers are used. Such duplexer devices are more fully and completely described in the previously referenced copending patent application entitled "Systems and Methods of Efficient Band Amplification." Alternatively, conventional duplexers may be configured to be used in the dual band and the triple band bidirectional amplification embodiments of the present invention.

Figure 8:
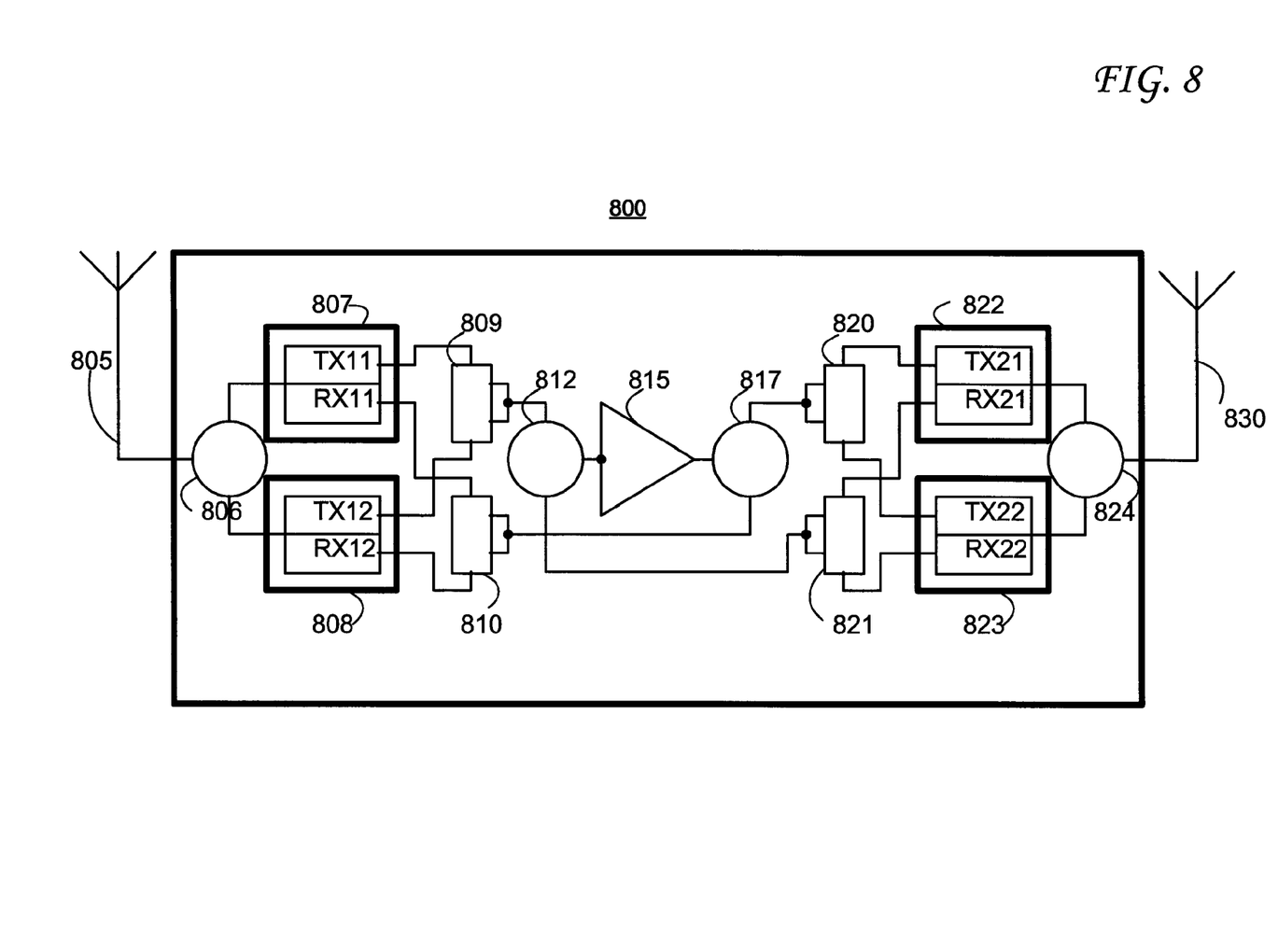

FIG. 8 displays a dual band bidirectional amplification device 800 in accordance with an alternative embodiment of the present invention. As shown in FIG. 8, the dual band bidirectional amplification device 800 includes only one amplifier enabled to amplify both downlink and uplink signals of the first and second frequency band. Furthermore the dual band bidirectional amplification device 800 utilizes conventional interconnect components including conventional duplexers. More particularly, the dual band bidirectional amplification device 800 can include four conventional duplexers, 807, 808, 822, and 823, four circulators, 806, 812, 817, and 824, and four interconnecting T-cables, 809, 810, 820, and 821. In an exemplary embodiment, the dual band bidirectional amplification device 800 is configured in a manner similar to the configuration of the dual band bidirectional amplification device 500 shown in FIG. 5. The significant difference between the dual band bidirectional amplification device 500 shown in FIG. 5 and dual band bidirectional amplification device 800, is that the two duplexer devices from amplification device 500, 510 and 525, are replaced by four conventional duplexers, 807, 808, 822, and 823, four T-cables, 809, 810, 820, and 821, and two circulators, 806 and 824 in amplification device 800. As shown in FIG. 8, dual band bidirectional amplification device 800 can be enabled to amplify signals from two frequency bands with only one amplifier.

Figure 9:
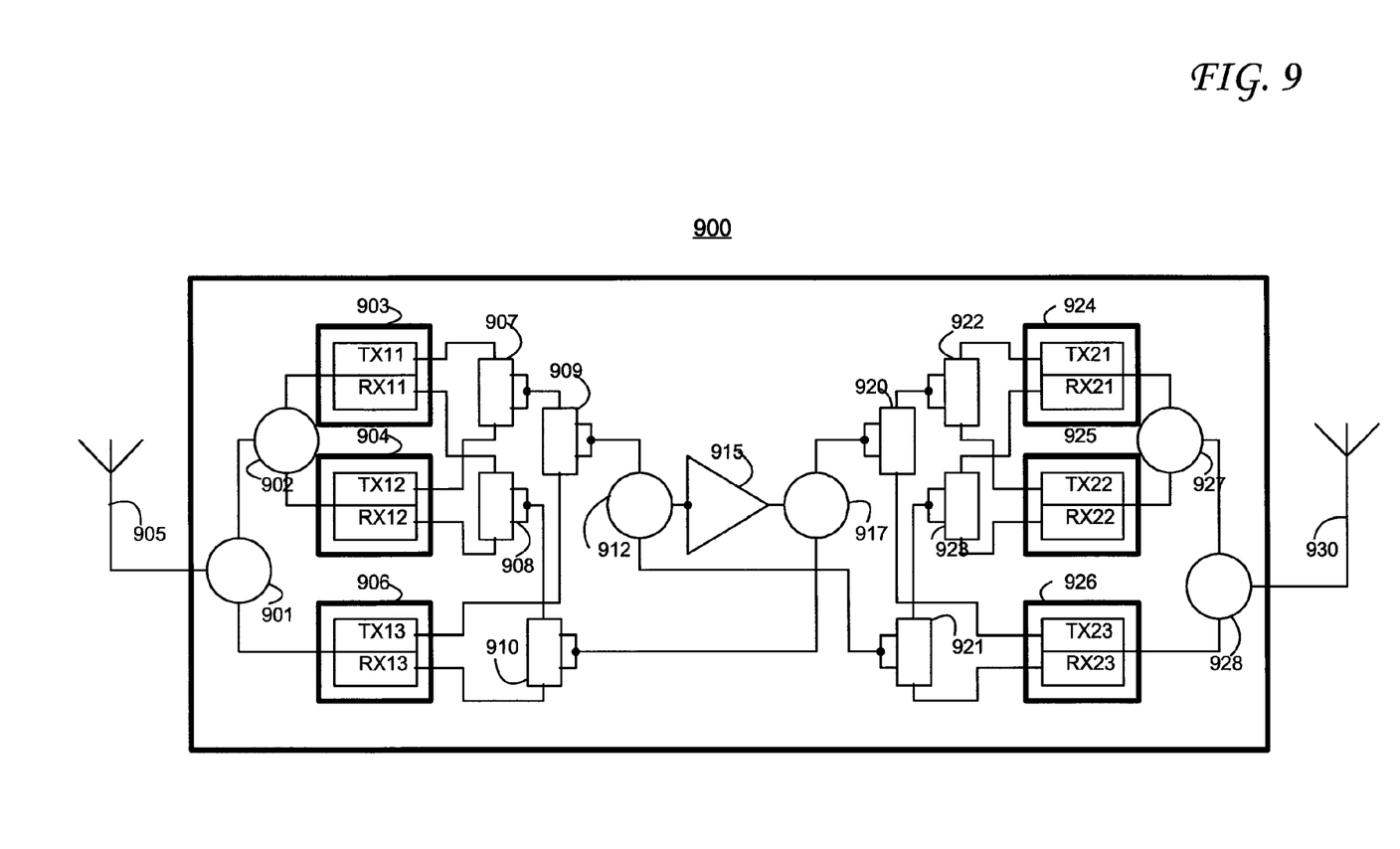
FIG. 9 displays a triple band bidirectional amplification device 900 in accordance with an alternative embodiment of the present invention.

FIG. 9 displays a triple band bidirectional amplification device 900 in accordance with an alternative embodiment of the present invention. As shown in FIG. 9, the triple band bidirectional amplification device 900 provides a device that includes only one amplifier to amplify both downlink and uplink signals of a first, second and third frequency band. Furthermore, the triple band bidirectional amplification device 900 utilizes conventional interconnect components including conventional duplexers. More particularly, the triple band bidirectional amplification device 900 includes six conventional duplexers, 903, 904, 906, 924, 925, and 926, six circulators, 901, 902, 912, 917, 927, and 928, and eight interconnecting T-cables, 907, 908, 909, 910, 920, 921, 922, and 923. In an exemplary embodiment of the triple band bidirectional amplification device 900 is configured in manner similar to the configuration of the triple band bidirectional amplification device 600 shown in FIG. 6. The significant difference between the triple band bidirectional amplification device 900 and the triple band bidirectional amplification device 600 shown in FIG. 6 is the two duplexer devices from amplification device 600, 610 and 625, are replaced by six conventional duplexers, 903, 904, 906, 924, 925 and 926, eight T-cables, 907, 908, 909, 910, 920, 921, 922, and 923, and four circulators, 901, 902, 927 and 928 in amplification device 900. As shown in FIG. 9, triple band bidirectional amplification device 900 can be enabled to amplify signals from three frequency bands with only one amplifier.

Similar to triple band bidirectional amplification device 900, the exemplary embodiment of the triple band bidirectional amplification device 700 shown in FIG. 7 can be constructed by using conventional duplexers, circulators and T-cables.

The variations configurations of the amplification device embodiments described herein can be selected according to the specific demands of a particular implementation. For some implementations, it may be advantageous to use a duplexer device, like duplexer device 510 or 610. In other implementations, it may be advantageous to use conventional duplexers, such as 808 or 903.

The architecture of the exemplary embodiments of the triple band bidirectional amplification device in accordance with the present invention, such as device 600 shown in FIG. 6, device 700 shown in FIG. 7, and device 900 shown in FIG. 9 provide many significant advantages over the prior art. Remarkably, the designs for triple band bi-directional amplification devices 600 and 900, shown in FIG. 6 and FIG. 9, contain only one amplifier component. Additionally, the triple band bidirectional amplification device 700 design shown in FIG. 7 contains only two amplifier components. Conventional prior art triple band bidirectional amplification devices generally have six amplifier components, or three amplifier chains. As the amplifier is most often the most expensive component of the triple band bidirectional amplification device, the cost of the exemplary embodiment of the triple band bidirectional amplification device 600 or triple band bidirectional amplification device 700 is greatly reduced from the cost of prior art devices. Conventional devices have numerous components, such as power dividers, that insert noise and add power loss to the system. The exemplary embodiments of the triple band bidirectional amplification device 600 and triple band bidirectional amplification device 700 have minimal power loss in comparison to conventional devices using power dividers and also insert minimal noise into the amplification system. Thereby, the embodiments of the present invention enable an extremely cost effective and efficient, band amplification system. Utilization of band bidirectional amplification devices in accordance with the present invention enables wireless service providers to expand and increase their service and coverage networks for their subscribers Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A band amplification device comprising:
a first amplifier having an input port and an output port;
a first circulator in communication with the input port of the first amplifier, wherein the input port of the first amplifier receives first and second frequency band downlink signals and first and second frequency band uplink signals;
a second circulator in communication with the output port of the first amplifier;
a second amplifier having an input port in communication with a third circulator and an output port in communication with a fourth circulator, wherein the input port of the second amplifier receives a third frequency band downlink signal and a third frequency band uplink signal;
a first duplexer device in communication with the first circulator and the second circulator; and
a second duplexer device in communication with the first circulator and the second circulator.

2. The device of claim 1, wherein the first frequency band is in an 800 MHz frequency range and the second frequency band is in a 900 MHz frequency range.

3. The device of claim 1, wherein the first frequency band is in an 800 MHz frequency range, the second frequency band is in a 900 MHz frequency range, and the third frequency band is in a 1900 MHz frequency range.

4. A multi-band bidirectional amplification wireless telecommunication system comprising:
a first amplifier;
a first circulator in communication with an input port of the first amplifier, wherein the input port of the first amplifier receives first and second frequency band downlink signals and first and second frequency band uplink signals;
a second circulator in communication with an output port of the first amplifier;
a second amplifier having an input port in communication with a third circulator and an output port in communication with a fourth circulator, wherein the input port of the second amplifier receives a third frequency band downlink signal and a third frequency band uplink signal;
a first duplexer device in communication with the first circulator and the second circulator; and
a second duplexer device in communication with the first circulator and the second circulator.

5. The system of claim 4, wherein the input port of the first amplifier receives a first frequency band in an 800 MHz frequency range and a second frequency band in a 900 MHz frequency range, and wherein the input port of the second amplifier receives a third frequency band in a 1900 MHz frequency range.

6. A multi-band amplification system comprising:
a first circulator in communication with a first amplifier device, wherein an input port of the first amplifier device receives first and second frequency band downlink signals and first and second frequency band uplink signals;
a second circulator in communication with the first amplifier device, wherein the first circulator routes at least a first frequency band downlink signal and at least a first frequency band uplink signal to the first amplifier device, and wherein the second circulator routes the first frequency band downlink signal and the first frequency band uplink signal from the first amplifier device for transmission; and
a second amplifier device having an input port in communication with a third circulator and an output port in communication with a fourth circulator, wherein the input port of the second amplifier receives a third frequency band downlink signal and a third frequency band uplink signal.

7. The system of claim 6, further comprising:
a plurality of duplexers that pass the first frequency band downlink signal and the first frequency band uplink signal to and from the first circulator and the second circulator.

8. The system of claim 7, wherein the plurality of duplexers receive and transmit the first frequency band downlink signal and the first frequency band uplink signal to and from a first antenna and a second antenna.

9. The system of claim 6, wherein the first circulator further routes a second frequency band downlink signal and a second frequency band uplink signal to the first amplifier device and wherein the second circulator routes the second frequency band downlink signal and the second frequency band uplink signal from the first amplifier device for transmission.

10. The system of claim 6, wherein the third circulator routes a third frequency band downlink signal and a third frequency band uplink signal to the second amplifier device and wherein the fourth circulator routes the third frequency band downlink signal and the third frequency band uplink signal from the second amplifier device for transmission.

11. A method of band amplification comprising:
receiving at least a first frequency band downlink signal at a first duplexer;
receiving at least a first frequency band uplink signal at a second duplexer;
transmitting the at least a first frequency band downlink signal from the first duplexer to a first circulator;
transmitting the at least a first frequency band uplink signal from the second duplexer to a first circulator;
transmitting the at least a first frequency band downlink signal and the at least a first frequency band uplink signal from a first circulator to an amplifier;
transmitting the at least a first frequency band downlink signal and the at least a first frequency band uplink signal from an amplifier to a second circulator;
transmitting the at least a first frequency band amplified downlink signal to a second duplexer from a second circulator; and
transmitting the at least a first frequency band amplified uplink signal to a first duplexer from a second circulator.

12. The method of claim 11, further comprising:
receiving a second frequency band downlink signal at the first duplexer;
receiving a second frequency band uplink signal at the second duplexer;
transmitting the second frequency band downlink signal from the first duplexer to the first circulator;
transmitting the second frequency band uplink signal from the second duplexer to the first circulator;
transmitting the second frequency band downlink signal and the second frequency band uplink signal from the first circulator to the amplifier;
transmitting the second frequency band downlink signal and the second frequency band uplink signal from the amplifier to the second circulator;
transmitting the second frequency band amplified downlink signal to the second duplexer from the second circulator; and
transmitting the second frequency band amplified uplink signal to the first duplexer from the second circulator.

13. The method of claim 12, further comprising:
receiving a third frequency band downlink signal at the first duplexer;
receiving a third frequency band uplink signal at the second duplexer;
transmitting the third frequency band downlink signal from the first duplexer to the first circulator;
transmitting the third frequency band uplink signal from the second duplexer to the first circulator;
transmitting the third frequency band downlink signal and the third frequency band uplink signal from the first circulator to the amplifier;
transmitting the third frequency band downlink signal and the third frequency band uplink signal from the amplifier to the second circulator;
transmitting the third frequency band amplified downlink signal to the second duplexer from the second circulator; and
transmitting the third frequency band amplified uplink signal to the first duplexer from the second circulator.

\* \* \* \* \*